(12) United States Patent
Hino et al.

(10) Patent No.: US 9,190,468 B2
(45) Date of Patent: Nov. 17, 2015

(54) SEMICONDUCTOR DEVICE

(71) Applicants: Shiro Hino, Tokyo (JP); Naruhisa Miura, Tokyo (JP); Akihiko Furukawa, Tokyo (JP); Tomokatsu Watanabe, Tokyo (JP); Kenichi Ohtsuka, Tokyo (JP); Hiroshi Watanabe, Tokyo (JP); Yuji Ebiike, Tokyo (JP)

(72) Inventors: Shiro Hino, Tokyo (JP); Naruhisa Miura, Tokyo (JP); Akihiko Furukawa, Tokyo (JP); Tomokatsu Watanabe, Tokyo (JP); Kenichi Ohtsuka, Tokyo (JP); Hiroshi Watanabe, Tokyo (JP); Yuji Ebiike, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 48 days.

(21) Appl. No.: 14/355,737

(22) PCT Filed: Sep. 24, 2012

(86) PCT No.: PCT/JP2012/074340
§ 371 (c)(1),
(2) Date: May 1, 2014

(87) PCT Pub. No.: WO2013/080641
PCT Pub. Date: Jun. 6, 2013

(65) Prior Publication Data
US 2014/0299891 A1    Oct. 9, 2014

(30) Foreign Application Priority Data

Dec. 1, 2011   (JP) ................................ 2011-263331

(51) Int. Cl.
*H01L 27/118*  (2006.01)
*H01L 21/44*   (2006.01)
*H01L 29/06*   (2006.01)
(Continued)

(52) U.S. Cl.
CPC ........ *H01L 29/0619* (2013.01); *H01L 29/0688* (2013.01); *H01L 29/0692* (2013.01);
(Continued)

(58) Field of Classification Search
CPC .................................................. H01L 29/0619
USPC ....................... 438/598, 128, 6; 257/202, 343
See application file for complete search history.

(56) References Cited

U.S. PATENT DOCUMENTS 5,408,118 A  *  4/1995  Yamamoto .................... 257/342
5,763,914 A     6/1998  Hshieh et al.
(Continued)

FOREIGN PATENT DOCUMENTS

EP           0823735    *  5/1996  ............. H01L 29/06
EP           0 823 735     2/1998
(Continued)

OTHER PUBLICATIONS

International Preliminary Report on Patentability issued Jun. 12, 2014 in PCT/JP2012/074340 filed on Sep. 24, 2012 (with English translation).

(Continued)

*Primary Examiner* — Calvin Lee
(74) *Attorney, Agent, or Firm* — Oblon, McClelland, Maier & Neustadt, L.L.P.

(57) ABSTRACT

A semiconductor device that can improve reliability while suppressing increase of a conduction loss or a switching loss. In the semiconductor device, when a two-dimensional shape on a main surface of the semiconductor substrate is an unit cell, the shape being a repeating unit of a plurality of well regions periodically disposed in a surface layer of a drift layer, one unit cell and another unit cell adjacent in an x-axis direction are disposed misaligned in a y-axis direction, and one unit cell and another unit cell adjacent in the y-axis direction are disposed misaligned in the x-axis direction.

9 Claims, 14 Drawing Sheets

(51) Int. Cl.
| | |
|---|---|
| *H01L 29/739* | (2006.01) |
| *H01L 29/66* | (2006.01) |
| *H01L 29/78* | (2006.01) |
| *H01L 29/16* | (2006.01) |
| *H01L 29/10* | (2006.01) |
| *H01L 29/808* | (2006.01) |

(52) U.S. Cl.
CPC ........ *H01L29/0696* (2013.01); *H01L 29/1095* (2013.01); *H01L 29/1608* (2013.01); *H01L 29/66068* (2013.01); *H01L 29/7396* (2013.01); *H01L 29/7802* (2013.01); *H01L 29/808* (2013.01)

(56) References Cited

U.S. PATENT DOCUMENTS 6,040,609 A    3/2000  Frisina et al.
8,890,242 B2 * 11/2014  Chang et al. .................. 257/334

FOREIGN PATENT DOCUMENTS

| | | |
|---|---|---|
| JP | 1 211978 | 8/1989 |
| JP | 5 235362 | 9/1993 |
| JP | 11 214529 | 8/1999 |
| JP | 2009 94314 | 4/2009 |
| WO | 99 04435 | 1/1999 |

OTHER PUBLICATIONS

Written Opinion issued Oct. 23, 2012 PCT/JP2012/074340 filed on Sep. 24, 2012 (with English translation).
Office Action issued Feb. 24, 2015 in Japanese Patent Application No. 2013-547021 (with partial English language translation).
International Search Report Issued Oct. 23, 2012 in PCT/JP12/074340 Filed Sep. 24, 2012.

* cited by examiner

F I G . 7
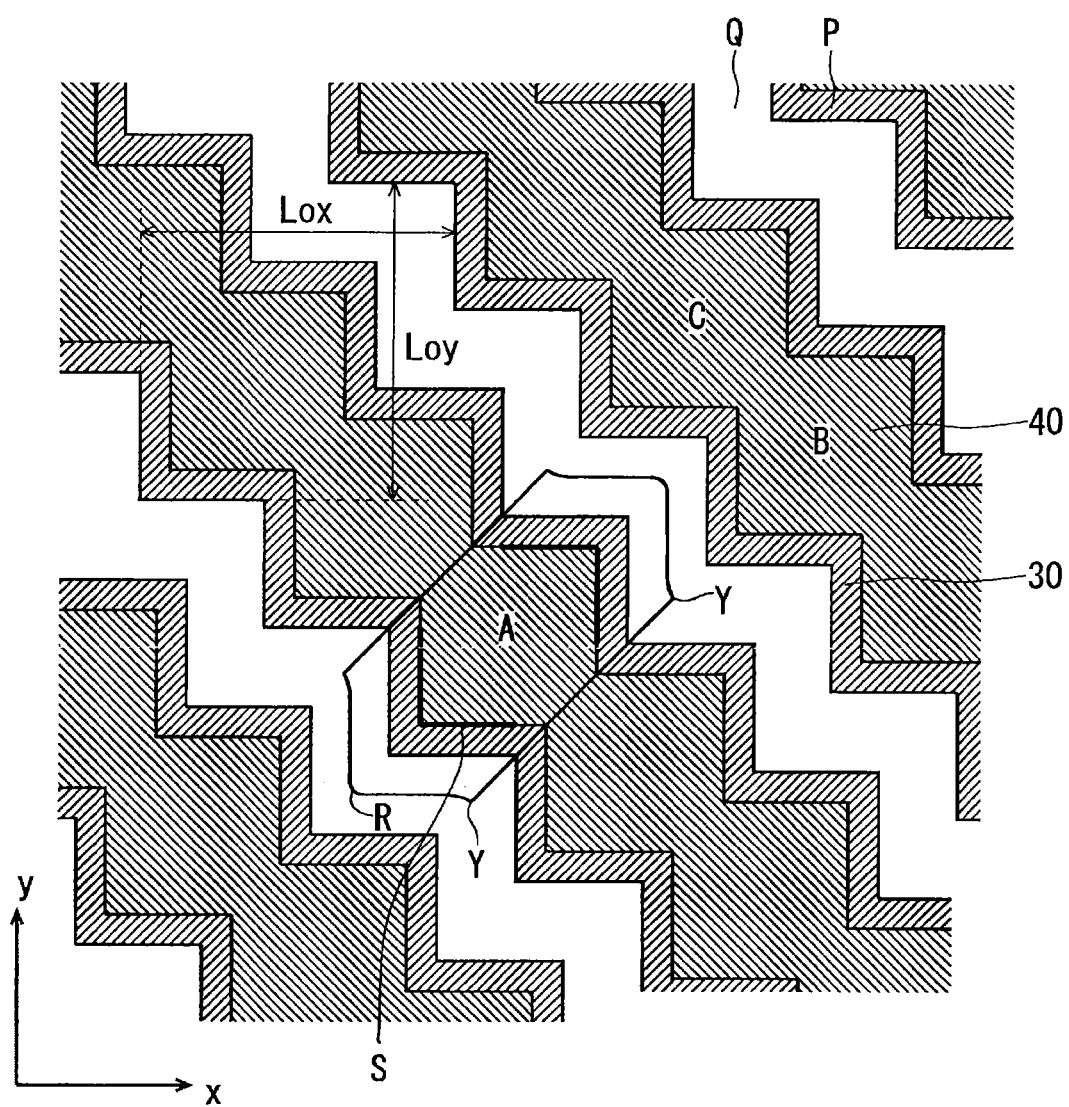

F I G . 8
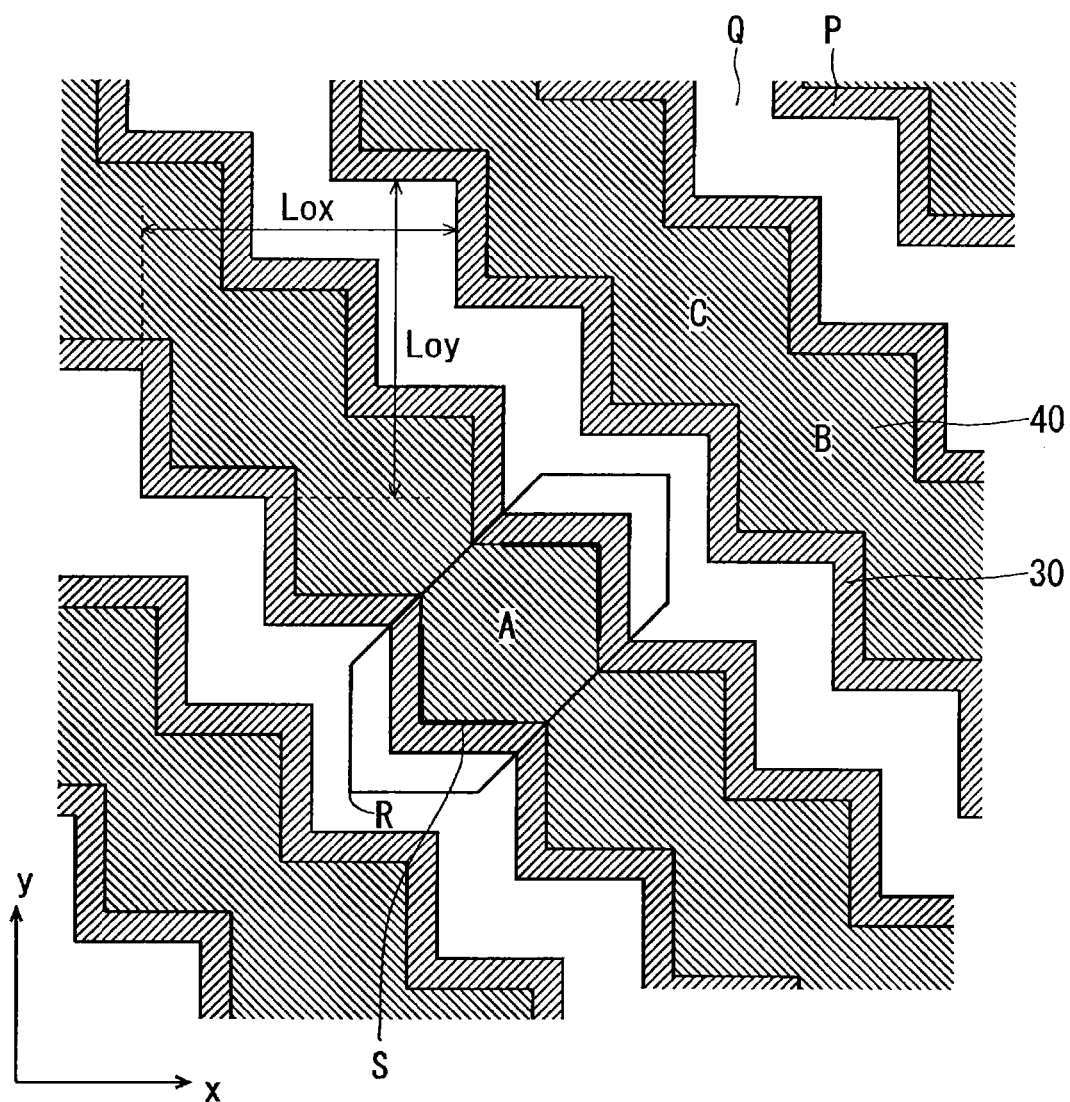

F I G. 1 2 A
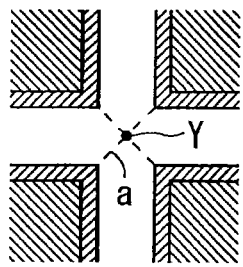
F I G. 1 2 B
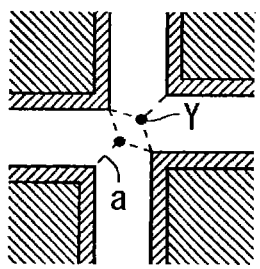
F I G. 1 2 C
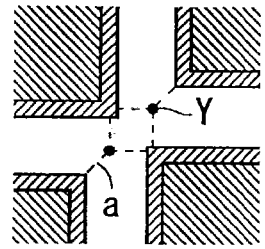
F I G. 1 2 D
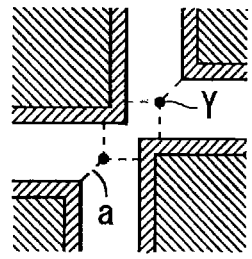
F I G. 1 2 E
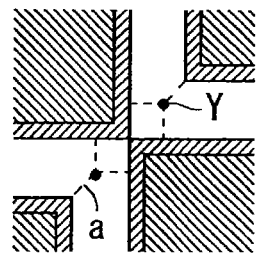
F I G. 1 2 F
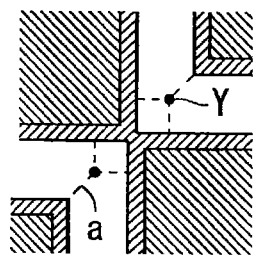

SEMICONDUCTOR DEVICE

TECHNICAL FIELD

The present invention relates to a semiconductor device, and more particularly to a power semiconductor device using silicon carbide.

BACKGROUND ART

In a vertical semiconductor device having a channel, such as a vertical metal oxide semiconductor field-effect transistor (MOSFET) and an insulated-gate bipolar transistor (IGBT), and in a structure generally called a planar type in which the channel is formed in a direction parallel to a main surface, in order to reduce channel resistance, a plane layout having high channel width density is desired.

As a method of forming the layout, for example, as disclosed in Patent Document 1 and Patent Document 2, forming channels in directions on two straight lines orthogonal to each other (hereinafter, grid arrangement) is widely known by making a well region a quadrangular cell shape in plan view and disposing the well region on a grid.

PRIOR ART DOCUMENT

Patent Document

Patent Document 1: Japanese Patent Application Laid-Open No. 01 (1989)-211978.
Patent Document 2: Japanese Patent Application Laid-Open No. 05 (1993)-235362.

SUMMARY OF INVENTION

Problems to be Solved by the Invention

The method described in Patent Document 1 has a problem that a JFET region formed between the well regions is formed in a mesh shape, that a high electric field is applied to a gate insulating film at the time of reverse bias application at a position corresponding to an intersection of the mesh, and that the gate insulating film is easily damaged.

On the other hand, since the channel width density is determined by a value obtained by dividing a channel width in a unit cell by a cell area (product of cell pitches of two directions), it is necessary to reduce the cell pitch for further increase of the channel width density, but this is not necessarily easy from a problem of processing precision, etc.

Methods of further increasing the channel width density in the grid arrangement include, as disclosed in Patent Document 2, continuously forming the cells disposed on a diagonal line.

However, when the method is used, in a channel formed in a well of a region that connects cells, since a distance from a contact region of a source electrode and a semiconductor layer becomes longer with respect to a channel formed in other regions, an increase of a conduction loss and a switching loss due to an increase of parasitic resistance or a delay at the time of switching is a concern.

The present invention has been made to solve the above problems, and an object is provision of a semiconductor device that can improve reliability of the device while suppressing the increase of the conduction loss and the switching loss.

Means for Solving the Problems

A semiconductor device according to the present invention includes a first conductivity type or second conductivity type semiconductor substrate, a first conductivity type drift layer formed on the semiconductor substrate, a plurality of quadrangle-shaped second conductivity type well regions disposed periodically in a surface layer of the drift layer with a length of a first side in plan view being a and a length of a second side orthogonal thereto in plan view being b, a first conductivity type source region formed on a surface layer of each of the well regions, a gate electrode formed over from each of the source region to the drift layer via a gate insulating film, and a channel region specified in the well regions opposite to each of the gate electrode, wherein, when a direction of the first side is an x-axis direction and a direction of the second side is a y-axis direction and when a distance between each of the well regions in the x-axis direction is A and a distance between each of the well regions in the y-axis direction is B, a second well region adjacent to a first well region in the x-axis direction, among the well regions, is disposed misaligned from the first well region in the y-axis direction by a width larger than zero and smaller than b+B, and a third well region adjacent to the first well region in the y-axis direction, among the well regions, is disposed misaligned from the first well region in the x-axis direction by a width larger than zero and smaller than a+A.

Effects of the Invention

The semiconductor device according to the present invention allows improvement in the reliability of the device while suppressing the increase of the conduction loss and the switching loss.

The objects, features, aspects, and advantages of the present invention will become more apparent by the following detailed description and accompanying drawings.

BRIEF DESCRIPTION OF DRAWINGS

FIG. 7 is a diagram schematically illustrating a planar structure of the semiconductor device.

FIG. 8 is a diagram schematically illustrating a planar structure of the semiconductor device.

FIG. 12 is a diagram schematically illustrating offset length dependence of point Y and a distance a.

DESCRIPTION OF EMBODIMENT

First Embodiment

<Configuration>

Figure 1:
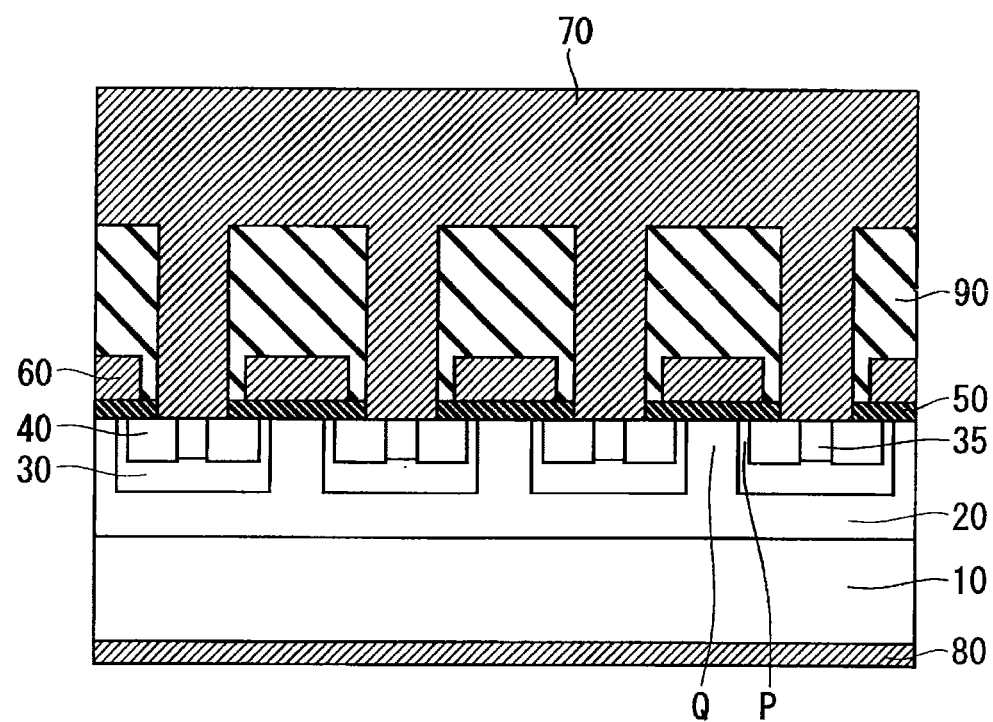
FIG. 1 is a diagram schematically illustrating a cross-sectional structure of a semiconductor device.

FIG. 1 is a cross-sectional schematic diagram of a semiconductor device in a first embodiment of the present invention. In the present embodiment, description will be provided as a vertical MOSFET using silicon carbide with a first conductivity type being a n-type and a second conductivity type being a p-type, but the conductivity type may be reverse, and the semiconductor device is not limited to the MOSFET.

In FIG. 1, a drift layer 20 including n-type silicon carbide is formed on a first main surface (upper surface in the figure) of an n-type, low-resistance semiconductor substrate 10 made of silicon carbide, the semiconductor substrate 10 having a polytype of 4H. A plane direction of the first main surface of the semiconductor substrate 10 is inclined 4° relative to a c-axis direction in (0001) plane.

On a drift layer 20 surface, a plurality of p-type well regions 30 containing aluminum (Al) that is a first impurity as a p-type impurity are formed spaced, that is, mutually at a distance of a certain width and periodically.

In addition, inside a surface layer portion of each well region 30 cross-section, a n-type source region 40 containing nitrogen (N) that is a second impurity as a n-type impurity is formed more shallowly than in the well region 30.

In addition, inside the well region 30, and desirably inside the source region 40, a well contact region 35 containing aluminum (Al) that is the first impurity as the p-type impurity is formed. The well region 30 and the well contact region 35 formed inside thereof are short-circuited electrically.

In addition, on the drift layer 20 surface including the well region 30, the source region 40, and the well contact region 35, a gate insulating film 50 made of silicon oxide is formed except for a portion of a source region 40 surface.

Moreover, on the gate insulating film 50, a gate electrode 60 is formed corresponding to a region interposed between a pair of source regions 40.

In addition, on a surface of the source region 40 and the well contact region 35 on which the gate insulating film 50 is not formed, a source electrode 70 is formed. The source electrode 70 is formed so as to cover the gate electrode 60 via an interlayer insulating film 90.

In addition, on a second main surface that is an opposite side of the first main surface of the semiconductor substrate 10, that is, on the back surface side, a drain electrode 80 is formed, respectively.

Here, in FIG. 1, out of the well regions 30, a region opposite to the gate electrode 60 via the gate insulating film 50, and in which an inversion layer is formed at the time of on operation of the semiconductor device, is referred to as a channel region (P in FIG. 1). In addition, an n-type region interposed between the two adjacent well regions 30 is referred to as a JFET region (Q in FIG. 1), and becomes a path through which an on current flows at the time of on operation (on state). Conversely, in an off state of the semiconductor device, a depletion layer extends from the well region 30 toward the JFET region, and prevents high electric field intensity from being applied to the gate insulating film 50 formed on the JFET region.

Here, a width of the JFET region, that is, a gap between two adjacent well regions 30 is referred to as a JFET length, and a gap between the well region 30 and the source region 40 inside the well region 30 in a surface layer of the well region 30 is referred to as a channel length. In addition, a period with which the well region 30 and the source region 40 are formed, that is, a length obtained by adding a width of one well region 30 and the JFET length is referred to as a cell pitch.

Although not illustrated in the present embodiment, on a periphery side of an element with respect to a region in which the well regions 30 are periodically located in a line, for the purpose of wiring or a high-withstand-voltage termination, a region (peripheral region) through which the on current does not pass in the on state is formed. In order to make a distinction from this region, a region in which the well regions 30 are periodically located in a line is referred to as an active region.

<Operation>

Next, operation of the semiconductor device according to the present embodiment will be described.

When a positive voltage equal to or higher than a threshold voltage is applied to the gate electrode 60 of the vertical MOSFET illustrated in FIG. 1, the inversion layer is formed in the channel region, and a path through which an electron as a carrier flows between the n-type source region 40 and the n-type drift layer 20 is formed.

The electron flowing from the source region 40 into the drift layer 20 follows an electric field formed by a positive voltage applied to the drain electrode 80, passes through the drift layer 20 and the semiconductor substrate 10, and reaches the drain electrode 80. Accordingly, by applying the positive voltage to the gate electrode 60, an on current flows from the drain electrode 80 to the source electrode 70. This state is referred to as an on state.

Conversely, when a voltage equal to or lower than the threshold voltage is applied to the gate electrode 60, the inversion layer is not formed in the channel region; therefore, a current does not flow from the drain electrode 80 to the source electrode 70. This state is referred to as an off state. At this time, due to the positive voltage applied to the drain electrode 80, a depletion layer extends from a pn junction between the drift layer 20 and the well region 30.

<Manufacturing Method>

Subsequently, a manufacturing method of the vertical MOSFET that is a silicon carbide semiconductor device of the first embodiment will be described.

First, on a surface of the n-type, low-resistance semiconductor substrate 10 having a polytype of 4H with the plane direction of the first main surface being (0001) plane, the drift layer 20 having n-type impurity concentration of $1\times10^{15}$ to $1\times10^{17}$ $cm^{-3}$ and thickness of 5 to 50 μm is epitaxially grown by a chemical vapor deposition (CVD) method.

Next, an implantation mask is formed on the surface of the drift layer 20 with a photoresist or the like, and Al as the p-type first impurity is ion-implanted. At this time, a depth of the ion implantation of Al shall be about 0.5 to 3 μm that does not exceed the thickness of the drift layer 20. In addition, the impurity concentration of the ion-implanted Al shall be greater than the n-type impurity concentration of the drift layer 20 in a range of $1\times10^{17}$ to $1\times10^{19}$ $cm^{-3}$.

Subsequently, the implantation mask is removed. The region into which Al is ion-implanted in accordance with the present process will be the well region 30.

Next, an implantation mask is formed on the drift layer 20 surface with a photoresist or the like, and N as the n-type second impurity is ion-implanted. An ion-implantation depth of N shall be shallower than the thickness of the well region 30. In addition, the impurity concentration of the ion-implanted N shall exceed the p-type impurity concentration of the well region 30 in a range of $1\times10^{18}$ to $1\times10^{21}$ $cm^{-3}$. The region that shows the n-type from among the N-implanted region in the drift layer 20 is to be the source region 40.

Next, an implantation mask is formed on the drift layer 20 surface with a photoresist or the like, and Al as the p-type first impurity is ion-implanted, and the implantation mask is removed. The region into which Al is implanted in the drift layer 20 in accordance with the present process is to be the well contact region 35.

The well contact region 35 is provided to obtain good electric contact between the well region 30 and the source electrode 70, and is desirably set to impurity concentration that is higher concentration than the well region 30 p-type impurity concentration. When the impurity is ion-implanted, it is desirable to heat the semiconductor substrate 10 to 150° C. or higher to implant ions for the purpose of decreasing the resistance of the well contact region 35.

Next, by heat treatment equipment, annealing of 1300 to 1900° C. and 30 seconds to one hour is performed in an inert gas atmosphere, such as argon (Ar) gas. The annealing activates the ion-implanted N and Al.

Subsequently, the surface of the drift layer 20 including the well region 30, the source region 40, and the well contact region 35 is thermally oxidized to form the gate insulating film 50 with desired thickness.

Next, a polycrystalline silicon film having conductivity is formed on the gate insulating film 50 by the low-pressure CVD method, and by patterning the polycrystalline silicon film, the gate electrode 60 is formed. Subsequently, an opening is provided in the gate insulating film 50.

Finally, the source electrode 70 electrically connected to the source region 40 and the well contact region 35 is formed, and the drain electrode 80 is formed on the back surface side of the semiconductor substrate 10 to complete the vertical MOSFET illustrated in FIG. 1. Here, materials to become the source electrode 70 and the drain electrode 80 include Al alloy.

<Planar Structure 1>

Figure 2:
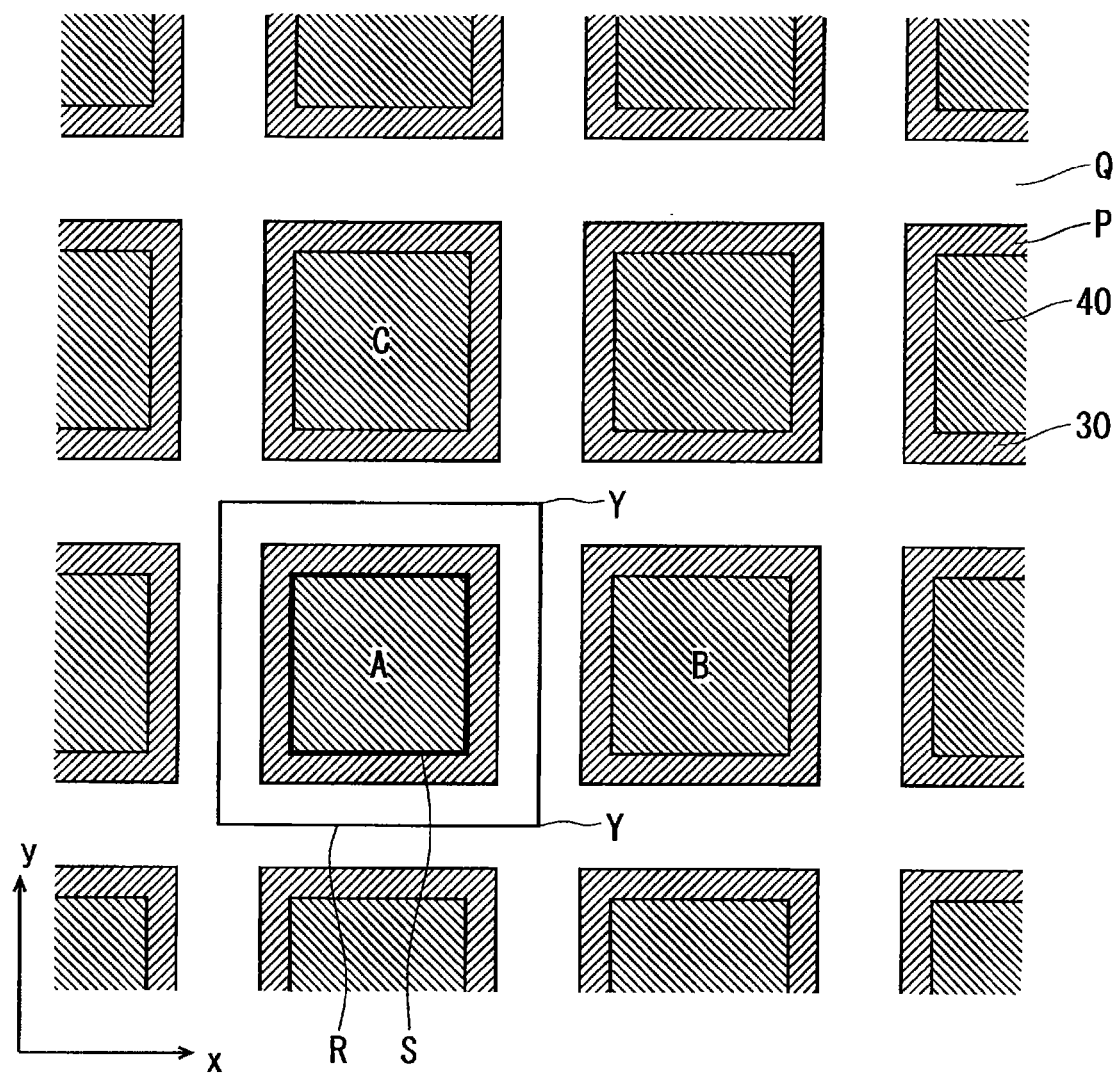
FIG. 2 is a diagram schematically illustrating a planar structure of a semiconductor device that is an underlying technology of the present invention.

FIG. 2 is a schematic plan view of an active region of the vertical MOSFET, which is an underlying technology of the present invention, viewed from the main surface side. For simplicity, focus is put on the well region 30 and the source region 40, and illustration of a surrounding configuration is omitted. Here, the well region 30 and the source region 40 do not need to be accurate squares (quadrangular shape) as illustrated in FIG. 2, and may include a shape including a curve in a portion of a side, or a shape with a portion being lost, a parallelogram, etc.

When an x-axis direction and a y-axis direction that are parallel to directions of the channels and orthogonal to each other are defined as in FIG. 2, with respect to a well region A (denoted as A in FIG. 2) that is one of the well regions 30, a well region B (denoted as B in FIG. 2) that is adjacent in a horizontal line direction is not misaligned in the y-axis direction, and a well region C (denoted as C in FIG. 2) that is adjacent in a vertical line direction is also not misaligned in the x-axis direction. That is, each well region 30 is disposed along the x-axis in the horizontal line direction and along the y-axis in the vertical line direction in a grid arrangement.

At this time, in the JFET region, when a line made by a set of points with a distance from any adjacent well region 30 being an equal distance is defined as a central line, a unit cell that is to be a unit structure of arrangement is a region surrounded by the central line (R in FIG. 2).

Channel width density is a value obtained by dividing a peripheral length (S in FIG. 2), in plan view, of the source region 40 by an area of the unit cell (R in FIG. 2).

Figure 3:
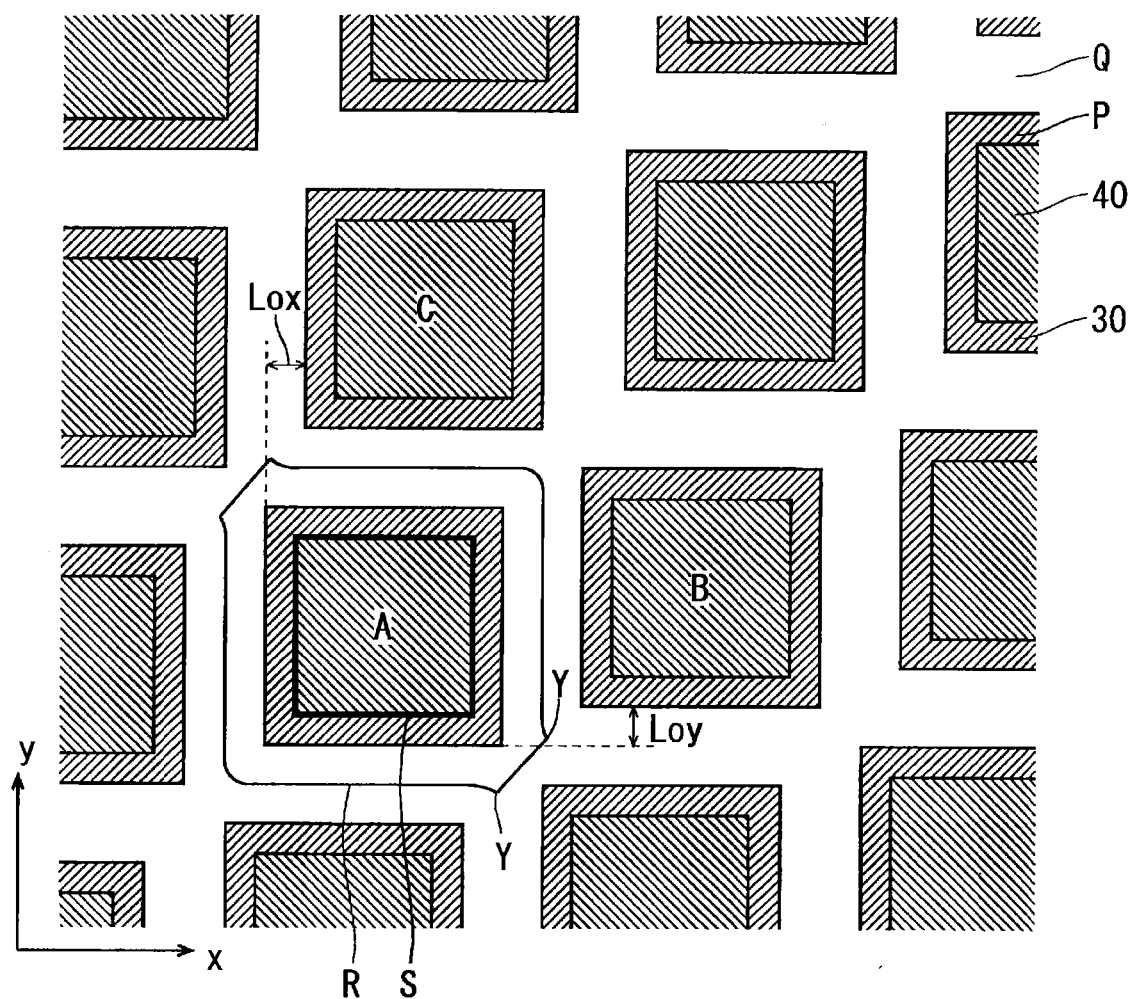
FIG. 3 is a diagram schematically illustrating a planar structure of the semiconductor device.

FIG. 3 is a schematic plan view of the active region of the vertical MOSFET of the present invention viewed from the main surface side. For simplicity, focus is put on the well region 30 and the source region 40, and illustration of a surrounding configuration is omitted.

In the present embodiment, the well region B that is adjacent to the well region A in the horizontal line direction is disposed misaligned by a length Loy in the y-axis direction, and the well region C that is adjacent to the well region A in the vertical line direction is disposed misaligned by a length Lox in the x-axis direction. Moreover, the horizontal line direction and the vertical line direction have a relationship that is not orthogonal.

In this arrangement, although the well region B and the well region C are spaced, the gap is shorter compared with the case of the grid arrangement. The arrangement is referred to as the present arrangement. The unit cell in the present arrangement is a region surrounded by the central line R as illustrated in FIG. 3.

The grid arrangement illustrated in FIG. 2 and the present arrangement illustrated in FIG. 3 will be compared regarding channel width density.

Figure 4:
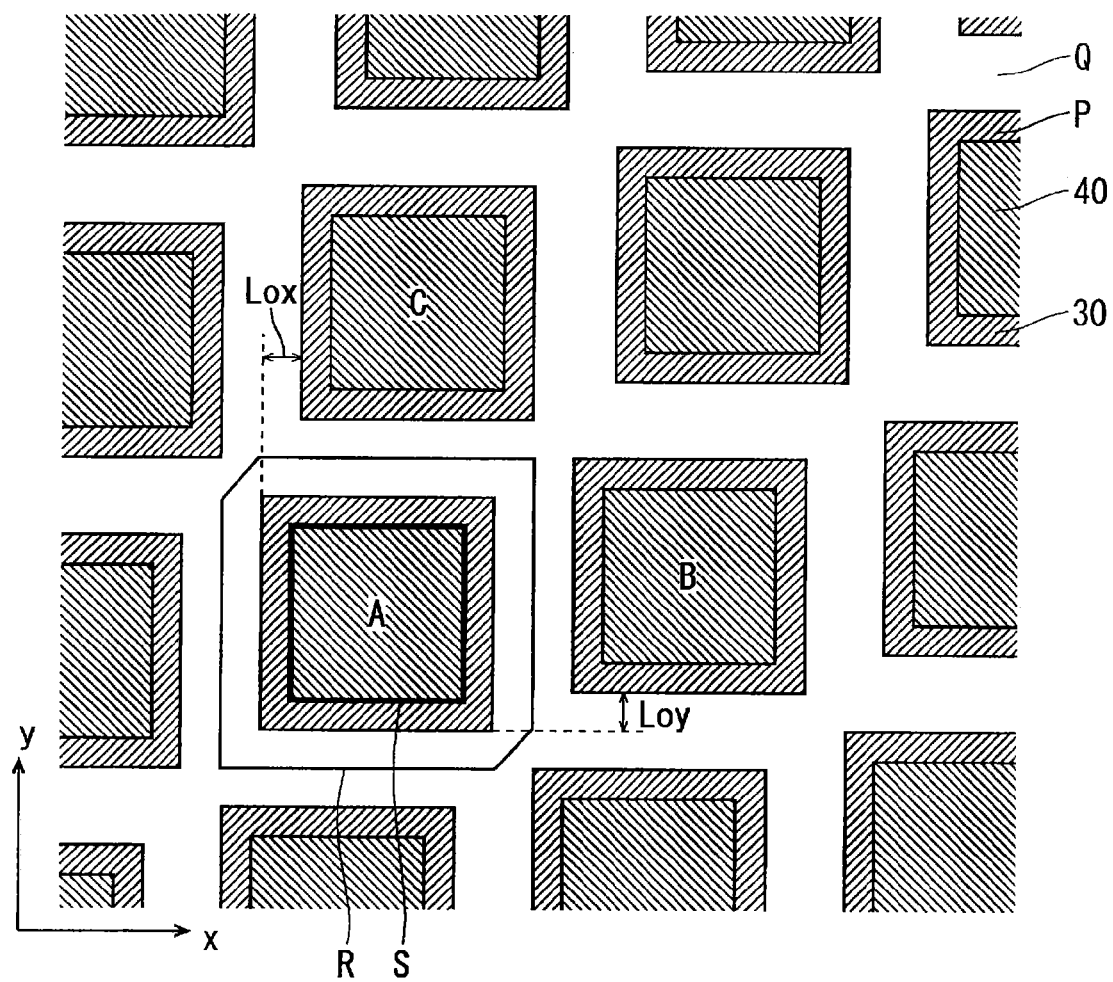
FIG. 4 is a diagram schematically illustrating a planar structure of the semiconductor device.

FIG. 4 illustrates a simplified shape of the unit cell illustrated in FIG. 3. As illustrated in FIG. 4, an area of the unit cell in the present arrangement is a hexagonal shape (the upper left and the lower right are subtracted in FIG. 4) obtained by subtracting two right triangles having orthogonal sides with a length Lox and a length Loy from the shape (quadrangular shape) of the unit cell of the grid arrangement, and is smaller relative to the area (quadrangular shape) of the unit cell of the grid arrangement.

On the other hand, the channel width (peripheral length of the source region 40 denoted by S in FIG. 3 and FIG. 4) in the unit cell in the present arrangement is identical to the unit cell (see FIG. 2) in the case of the grid arrangement; therefore the channel width density is larger in the case of the present arrangement compared with the case of the grid arrangement by the smaller area of the unit cell.

Next, the grid arrangement and the present arrangement will be compared regarding reliability of the gate insulating film 50 on the JFET region.

In the grid arrangement, an intersection (point Y in FIG. 2) of the orthogonal central lines is a point on the JFET region where a distance from the adjacent well region 30 becomes the farthest in each unit cell. Accordingly, at this point, electric field intensity applied to the gate insulating film 50 in the off state becomes the highest.

On the other hand, in the present arrangement, point Y on the central line illustrated in FIG. 3 is a point on the JFET region where the distance from the adjacent well region 30 becomes the farthest. Accordingly, at this point, the electric field intensity applied to the gate insulating film 50 in the off state becomes the highest, but the distance to the nearest well region 30 becomes smaller than at point Y in the grid arrangement (more specific description will be given later).

At a point in the JFET region where the distance to the adjacent well region 30 is far, since the depletion layer is hard to extend from the well region 30 in the off state, high electric field intensity is easy to be applied to the gate insulating film 50 right above. That is, a maximum value of the electric field intensity applied to the gate insulating film 50 in the off state is smaller in the present arrangement, and high reliability can be obtained.

In view of the foregoing, by using the cell arrangement described in the present embodiment, increase in channel width density and improvement in reliability can be simultaneously obtained.

<Planar Structure 2>

Figure 5:
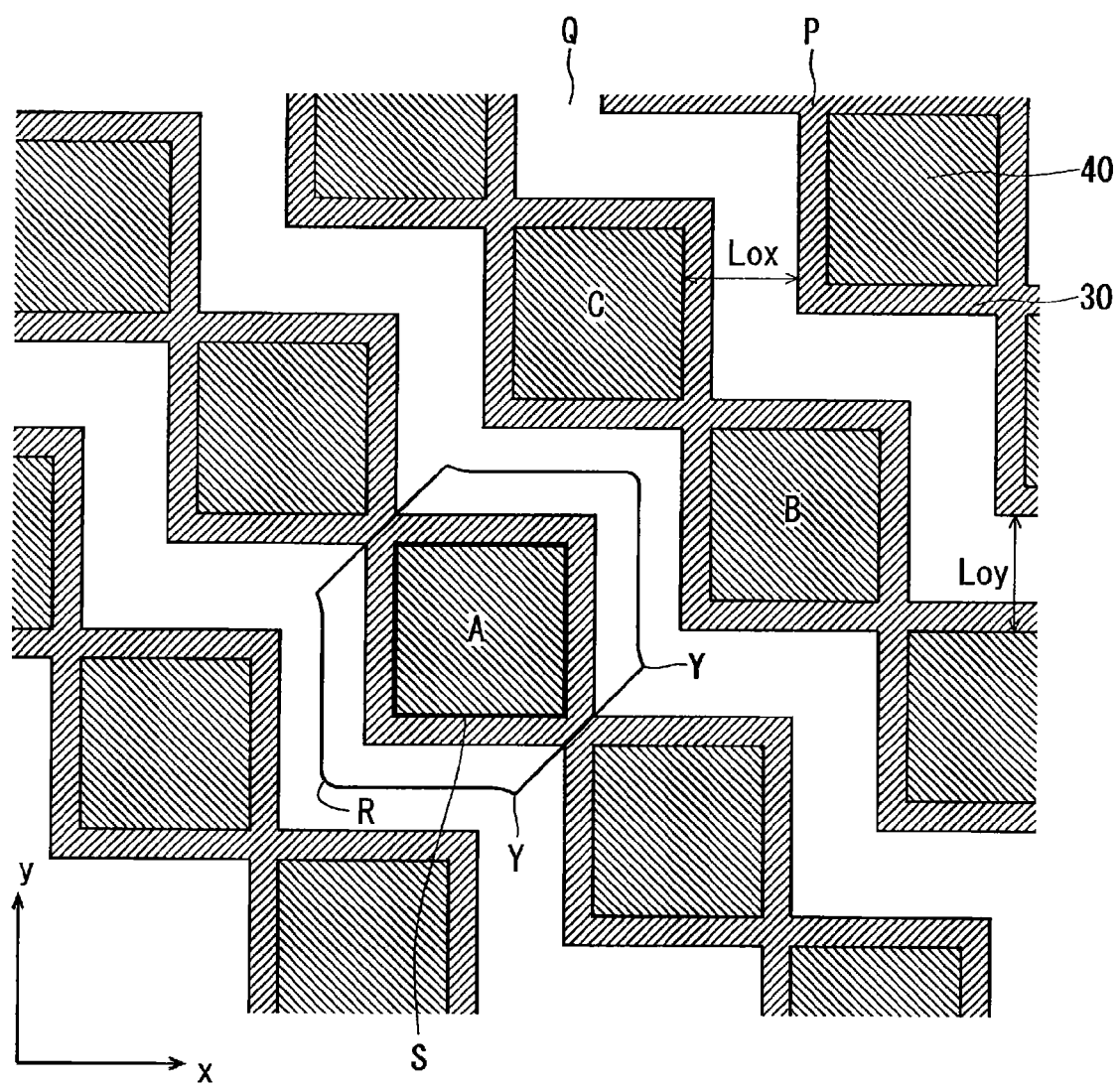
FIG. 5 is a diagram schematically illustrating a planar structure of the semiconductor device.

FIG. 5 is a schematic plan view of the active region of the vertical MOSFET of the present invention viewed from the main surface side. For simplicity, focus is put on the well region 30 and the source region 40, and illustration of a surrounding configuration is omitted.

In the structure illustrated in FIG. 5, as is the case illustrated in FIG. 3, the well region B that is adjacent to the well region A in the horizontal line direction is disposed misaligned by the length Loy in the y-axis direction, and the well region C that is adjacent to the well region A in the vertical line direction is disposed misaligned by the length Lox in the x-axis direction. What is different from FIG. 3 is that the well region B and the well region C overlap each other, and that a shape of each well region is no longer a quadrangular shape because either of the length Lox or the length Loy, or both of them are larger than those in the case in FIG. 3. This is achieved by the well region B and the well region C overlapping and making a well region connecting regions of a logical addition thereof. A boundary of the unit cell is as illustrated (R in FIG. 5).

Figure 6:
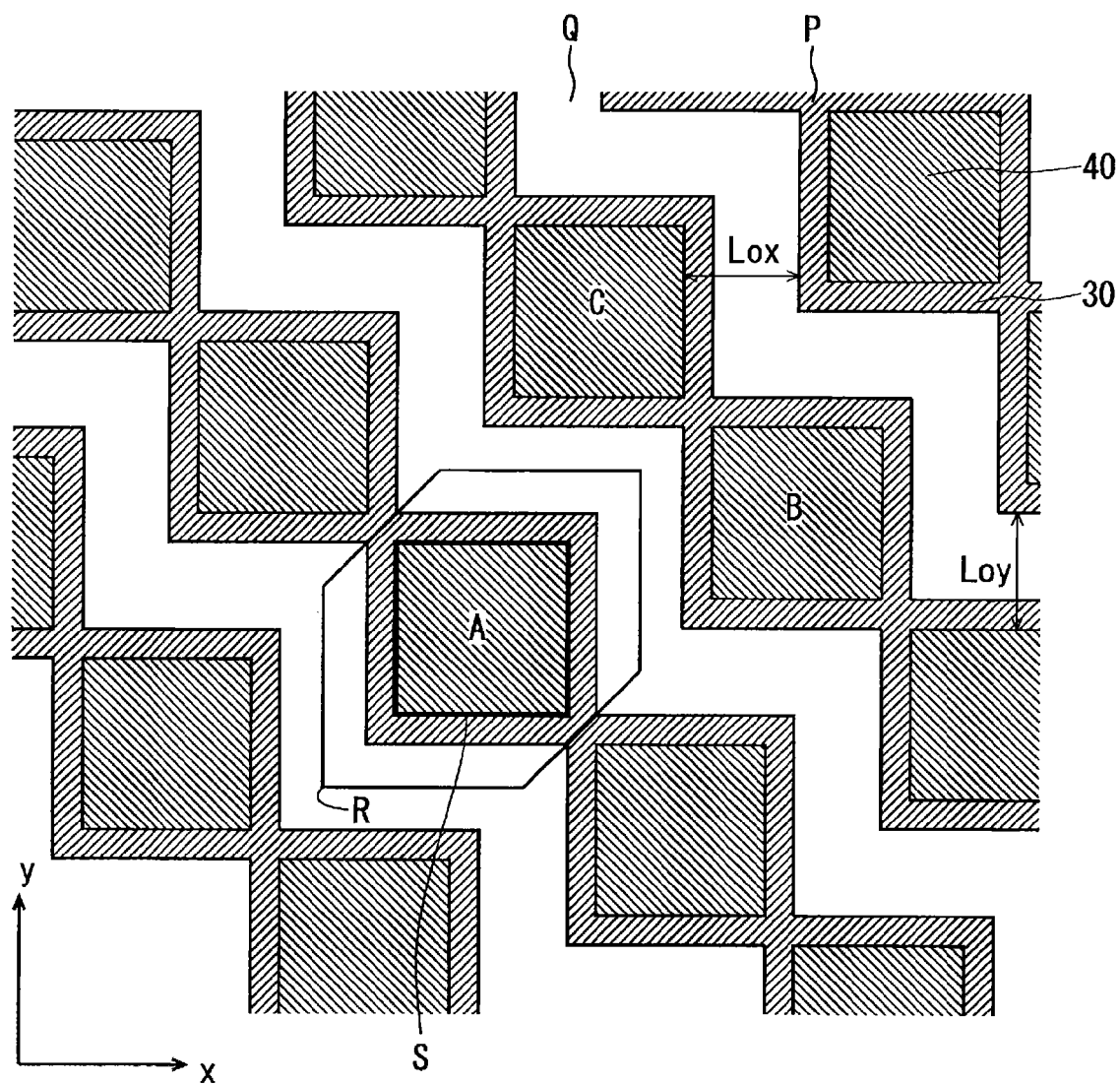
FIG. 6 is a diagram schematically illustrating a planar structure of the semiconductor device.

FIG. 6 illustrates a simplified shape of the unit cell illustrated in FIG. 5. In the case of FIG. 6, since the area of the right triangle to subtract becomes larger compared with the case of FIG. 4, the unit cell can be made smaller. Since the channel width remains as is, the channel width density becomes larger.

Moreover, as illustrated in FIG. 5, at point Y on the JFET region where the distance from the adjacent well region 30 is the farthest, the distance to the nearest well region 30 becomes smaller than that at point Y in the grid arrangement (more specific description will be given later). Accordingly, the maximum value of the electric field intensity applied to the gate insulating film 50 in the off state becomes smaller, and high reliability can be obtained.

In view of the foregoing, by using the cell arrangement described in the present embodiment, increase in channel width density and improvement in reliability can be simultaneously obtained.

<Planar Structure 3>

FIG. 7 is a schematic plan view of the active region of the vertical MOSFET of the present invention viewed from the main surface side. For simplicity, focus is put on the well region 30 and the source region 40, and illustration of a surrounding configuration is omitted.

In the structure illustrated in FIG. 7, as is the case illustrated in FIG. 3, the well region B that is adjacent to the well region A in the horizontal line direction is disposed misaligned by the length Loy in the y-axis direction, and the well region C that is adjacent to the well region A in the vertical line direction is disposed misaligned by the length Lox in the x-axis direction. What is different from FIG. 3 and FIG. 5 is that the well region B and the well region C overlap each other, and that the source region in the well region B and the source region in the well region C overlap each other because either of the length Lox or the length Loy or both of them are larger than those in the case in FIG. 3 and FIG. 5. This is achieved by the source region in the well region B and the source region in the well region C overlapping and making a source region connecting regions of a logical addition thereof. A boundary of the unit cell is as illustrated (R in FIG. 7).

FIG. 8 illustrates a simplified shape of the unit cell illustrated in FIG. 7. In the case of FIG. 8, since the area of the right triangle to subtract becomes larger compared with the case of FIG. 4 and FIG. 6, the unit cell can be made smaller. Accordingly, when the channel width is comparable, the channel width density becomes larger.

Moreover, as illustrated in FIG. 7, at point Y on the JFET region where the distance from the adjacent well region 30 is the farthest, the distance to the nearest well region 30 becomes smaller than that at point Y in the grid arrangement (more specific description will be given later). Accordingly, the maximum value of the electric field intensity applied to the gate insulating film 50 in the off state becomes smaller, and high reliability can be obtained.

In view of the foregoing, by using the cell arrangement described in the present embodiment, increase in channel width density and improvement in reliability can be simultaneously obtained.

DETAILED DESCRIPTION

A conduction loss generated when the MOSFET is in the on state is reduced by reducing resistance between a source and a drain, that is, on resistance. Channel resistance is one of resistance components that constitute the on resistance, and reduction is desired.

Particularly in a MOSFET using silicon carbide, it is widely known that, since the interfacial characteristic of an oxide film and silicon carbide is not preferable, high channel mobility is not obtained, easily resulting in high channel resistance, and the improvement thereof is desired.

Methods of reducing the channel resistance include increasing the channel width density. The channel width density refers to a value obtained by dividing width of all the channels that exist in the active region by an area of the active region. Generally, in a power semiconductor element, since identically shaped unit cells are periodically located in a line, the channel width density can be calculated by dividing the channel width in the unit cell by the area of the unit cell.

Methods of increasing the channel width density are roughly classified into two, i.e., scaling down and contrivance of the cell arrangement.

Scaling down is a method of reducing the cell pitch by making the size smaller, such as the JFET length and the channel length, but limitations are restricted in terms of the limit of fine-processing technology, deterioration of device characteristics, etc.

In the following, a method of increasing the channel width density by the contrivance of the cell arrangement will be described in detail. First, improvement in the channel width density by the contrivance of the cell arrangement will be described by taking a comb-type arrangement (forming the well region in a rectangular shape and forming the channel only in one straight line direction) and the grid arrangement as examples.

Figure 9:
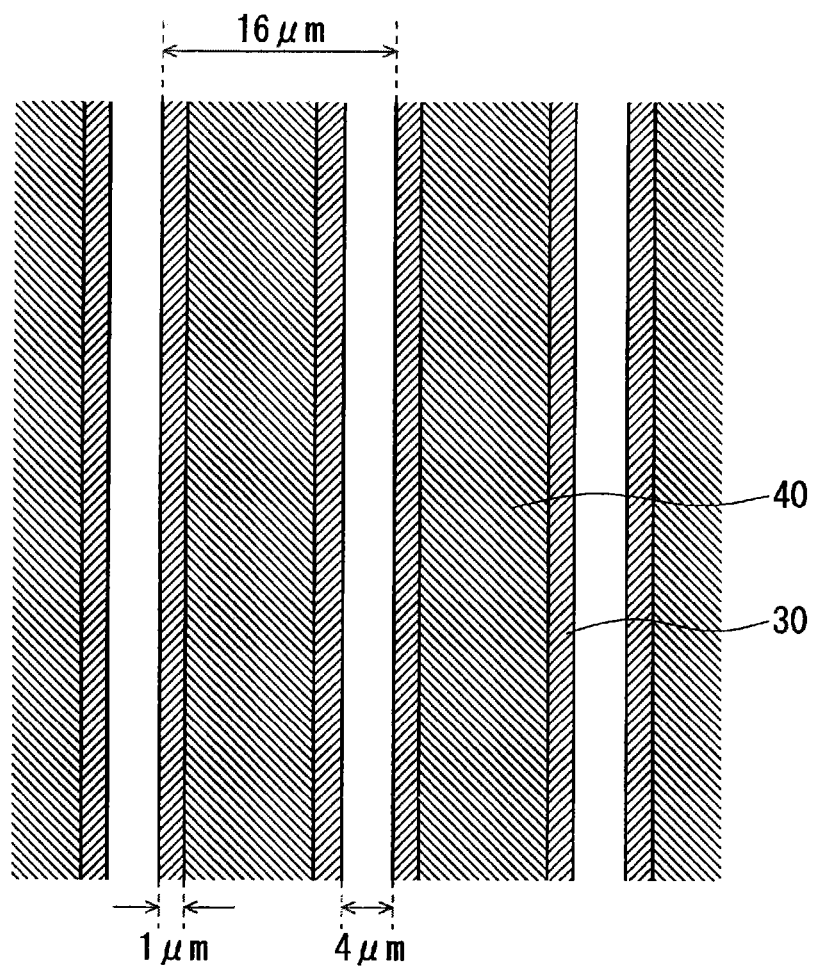
FIG. 9 is a diagram schematically illustrating a planar structure of the semiconductor device that is the underlying technology of the present invention.
Figure 10:
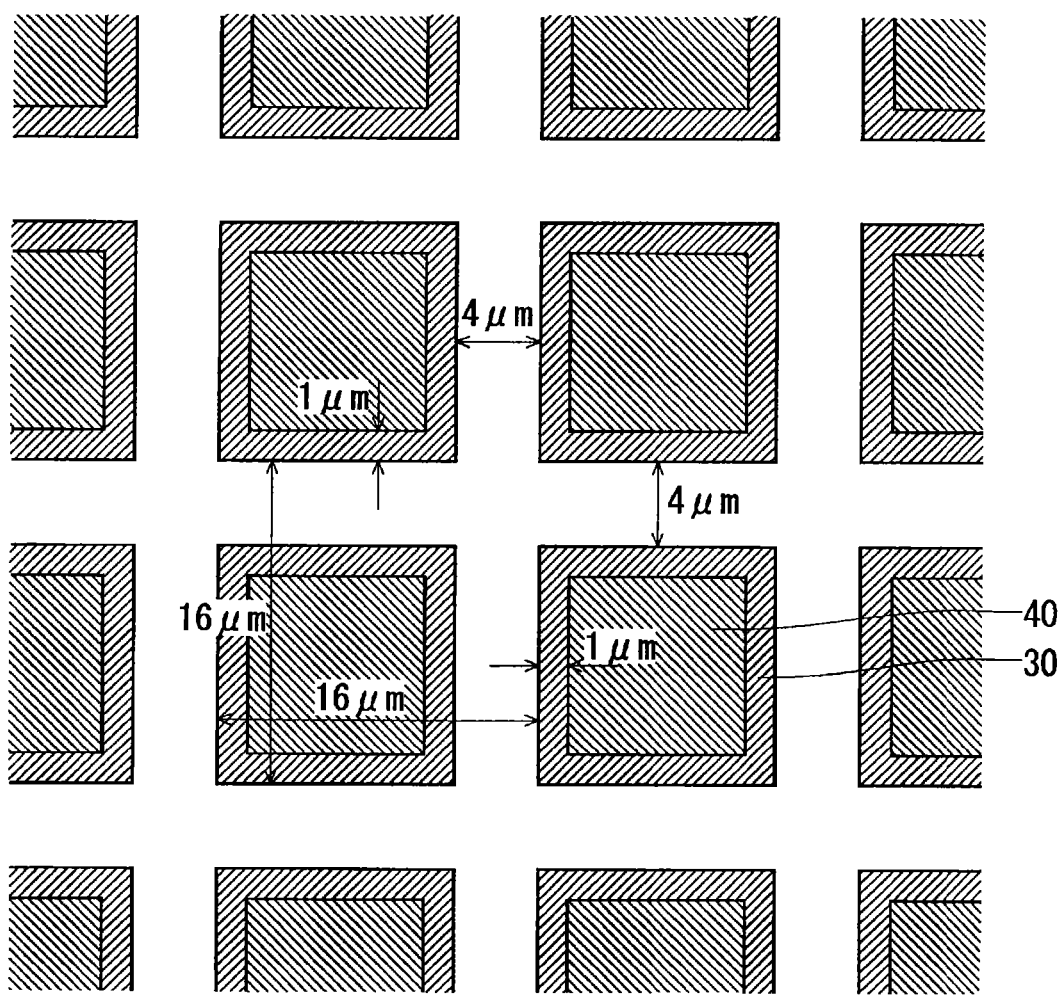
FIG. 10 is a diagram schematically illustrating a planar structure of the semiconductor device that is the underlying technology of the present invention.

FIG. 9 and FIG. 10 illustrate planar arrangement of the well region 30 and the source region 40 in the comb-type arrangement (FIG. 9) and the grid arrangement (FIG. 10). Here, in either arrangement, the cell pitch is assumed to be 16 μm, the channel length is assumed to be 1 μm, and the JFET length is assumed to be 4 μm.

In the case of the comb-type arrangement, since two channels exist in a period of the cell pitch 16 μm, the channel width density is calculated as 0.125 $\mu m^{-1}$ that is obtained by dividing 2 by 16 μm (see FIG. 9).

On the other hand, in the case of the grid arrangement, since four channels of 10 μm per one side exist in the unit cell having an area of 16 μm square, 0.156 $\mu m^{-1}$, the channel width density is obtained by dividing 40 μm by the square of 16 μm (see FIG. 10).

That is, this means that, even if an identical cell pitch is used, the use of the grid arrangement can increase the channel width density.

In a state in which the MOSFET is off, a high voltage of hundreds to thousands of volts is generated in the drain electrode 80. At this time, the depletion layer is generated extending from the well region 30 electrically short-circuited to the grounded source electrode 70 toward the drift layer 20, which cuts off a voltage applied between the drain electrode 80 and the source electrode 70.

Worthy of special note is that this depletion layer serves to screen out the drain voltage by also extending from the well region 30 toward the JFET region, and to reduce the electric field intensity generated to the gate insulating film 50 that exists in a region interposed between the gate electrode 60 which is generally zero volt and the JFET region.

Since this screening-out effect is difficult to occur when the JFET length is wide, a high electric field is generated in the gate insulating film 50 right above the JFET region, and breakdown of the gate insulating film 50 occurs easily.

This may easily pose a particular problem in a silicon-carbide-containing wide-bandgap semiconductor element that is designed so that a dielectric breakdown electric field may be high and the electric field intensity in the semiconductor may be high because the electric field intensity applied to the gate insulating film 50 also becomes high easily.

When attention is paid to the above-described grid arrangement, since the JFET region is formed in a mesh shape, the intersection of the central line that is a line formed by a set of points with the distance from any adjacent well region 30 being an identical distance has a longer distance to the well region 30 compared with other points in the JFET region. Specifically, the distance from the intersection of the central line to the nearest well region 30 is up to √2 times larger compared with other points on the central line. Accordingly, a high electric field is easily applied to the gate insulating film 50 right above the intersection of the central line in the off state.

Next, the present arrangement of the present invention will be described.

Figure 11:
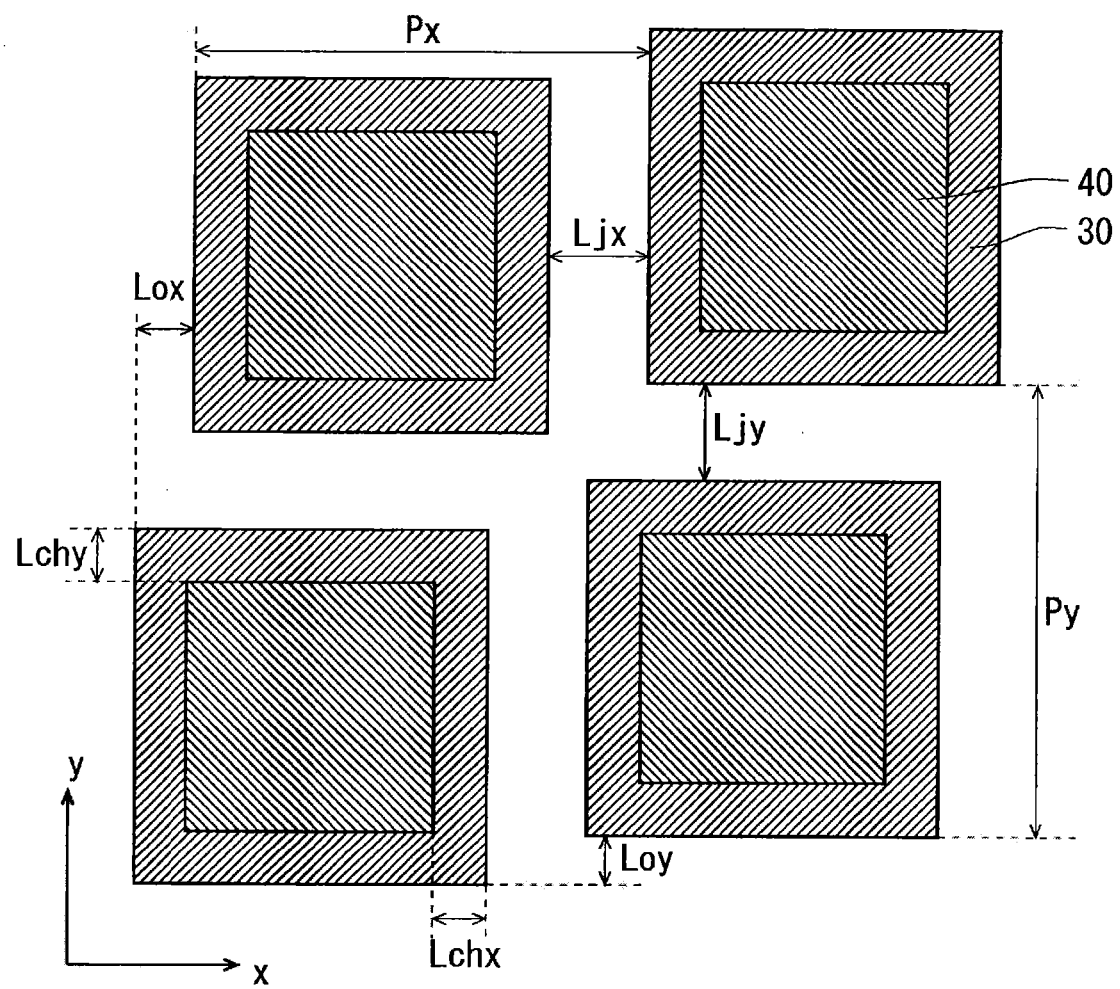
FIG. 11 is a diagram illustrating each length in a planar structure of the semiconductor device.

As illustrated in FIG. 11, an x-axis direction and a y-axis direction that are parallel with the channels and orthogonal to each other are defined, a cell pitch of the x-axis direction is defined as a cell pitch Px, and a cell pitch of the y-axis direction is defined as a cell pitch Py.

In addition, channel lengths of the x-axis direction and the y-axis direction are defined as a channel length Lchx and a channel length Lchy, respectively, and JFET lengths of the x-axis direction and the y-axis direction are defined as a JFET length Ljx and a JFET length Ljy, respectively. Hereinafter, the channel length Lchx and the channel length Lchy may be described as a channel length Lch, and the JFET length Ljx and the JFET length Ljy may be described as a JFET length Lj.

When viewed from a certain well region A that is one of the well regions 30, a well region B adjacent in a horizontal line direction (+x (>0) side in FIG. 11) is misaligned by +Loy (>0) in the y-axis direction, and a well region C adjacent in a vertical line direction (+y (>0) side in FIG. 11) is misaligned by +Lox (>0) in the x-axis direction. These length Lox and length Loy are referred to as an offset length.

In the plan view illustrated in FIG. 11, a location corresponding to each length is illustrated by an arrow. Here, "a well region adjacent in a horizontal line direction", which is a well region adjacent in the x-axis direction in FIG. 11, refers to a well region with a direct distance from the well region being the closest among the well regions with an x-coordinate being different by a length equivalent to the cell pitch of the x-axis direction and a y-coordinate being different by the length Loy in FIG. 11. "A well region adjacent in a vertical line direction", "a unit cell adjacent in a horizontal line direction", and the like are also defined similarly.

FIG. 12 illustrates a state in which the location of point Y with the distance from the adjacent well region 30 being the farthest changes when the JFET length Lj is 4 μm and the length Lox and the length Loy are simultaneously increased 1 μm at a time from 0 μm. In this case, Lox=Loy=0 μm means that the cell arrangement is a grid arrangement.

It will be appreciated that, when the offset lengths are increased until the length Lox and the length Loy become about 2 μm, a distance from point Y to the adjacent well region 30 gradually becomes shorter (see FIGS. 12A to 12F).

Specifically, in FIG. 12A, Δx=Δy=0 μm and the distance a is 2.8 μm, in FIG. 12B, Δx=Δy=1 μm, and the distance a is 2.5 μm, in FIG. 12C, Δx=Δy=2 μm, and the distance a is 2.3 μm, in FIG. 12D, Δx=Δy=3 μm, and the distance a is 2.3 μm, in FIG. 12E, Δx=Δy=4 μm, and the distance a is 2.3 μm, and in FIG. 12F, Δx=Δy=5 μm, and the distance a is 2.3 μm.

In this case, for simplicity, the case where the length Lox and the length Loy are equal to each other has been described, but similarly in the case where the length Lox and the length Loy are not equal to each other, it is easily supposed that a horizontal line direction and a vertical line direction are not orthogonal to each other when Lox>0 and Loy>0, and that the distance from point Y to the adjacent well region 30 becomes smaller as the offset length is increased until the well region B and the well region C come into contact with each other.

That is, compared with the grid arrangement, by making the length Lox and the length Loy larger than zero, the distance from point Y to the adjacent well region 30 becomes smaller, and the maximum value of the electric field applied to the gate insulating film 50 in the off state is reduced. As a result, a high-reliability MOSFET with the gate insulating film 50 being hard to be destroyed is achieved.

FIG. 13 illustrates a shape of the unit cell and changes of the channel regions in the unit cell when the JFET length Lj is 4 μm, the channel length Lch is 1 μm, and the length Lox and the length Loy are simultaneously increased by 2.5 μm at a time from 0 μm.

The area of the unit cell is equivalent to Px×Py−Lox×Loy; therefore, as the offset length is increased, the area of the unit cell decreases (see FIGS. 13A to 13D).

Figure 13A:
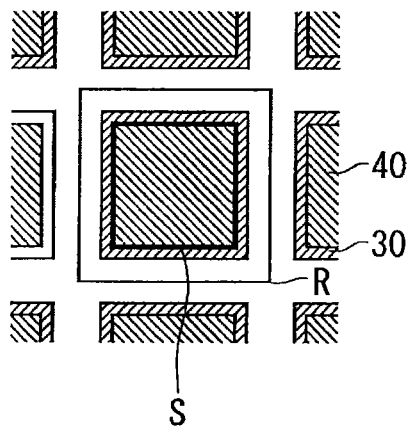
FIG. 13 is a diagram schematically illustrating offset length dependence of a unit cell area and a length equivalent to a channel width in the cell.
Figure 13B:
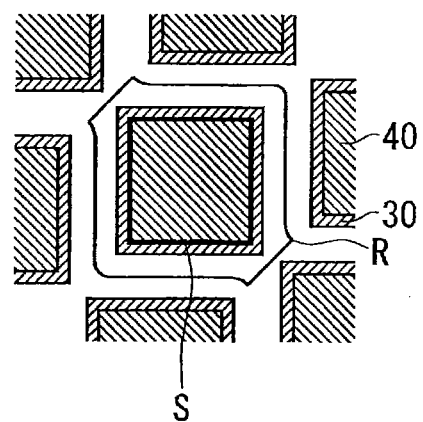
Figure 13C:
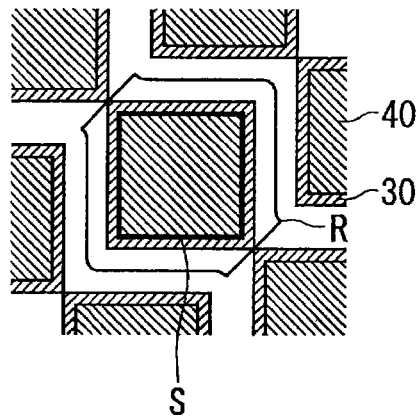
Figure 13D:
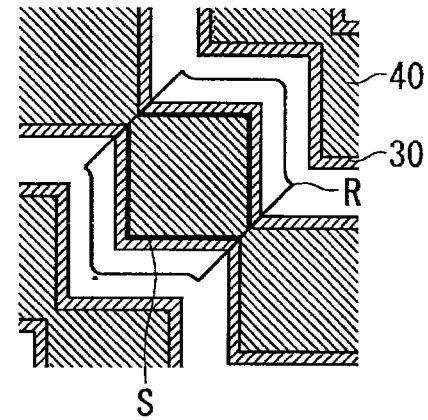

Specifically, in FIG. 13A, Δx=Δy=0 μm, the length equivalent to the channel width is 40 μm, and the area of the unit cell is 256 μm$^2$, in FIG. 13B, Δx=Δy=2.5 μm, the length equivalent to the channel width is 40 μm, and the area of the unit cell is 250 μm$^2$, in FIG. 13C, Δx=Δy=5 μm, the length equivalent to the channel width is 40 μm, and the area of the unit cell is 231 μm$^2$, and in FIG. 13D, Δx=Δy=7.5 μm, the length equivalent to the channel width is 30 μm, and the area of the unit cell is 200 μm$^2$.

When the length Lox and the length Loy are 5 μm or less, the shape of the channel region in the unit cell does not change and the channel width in the unit cell is also constant; therefore, the channel width density increases as the offset amount is larger.

On the other hand, when the length Lox and the length Loy exceed 5 μm that is equivalent to the channel length Lch+ JFET length Lj, in some region of the periphery of the source region 40, since an n-type region (JFET region) that exists in a region away by the distance of the channel length Lch viewed from the periphery of the source region 40 will be filled by the well region 30 of an adjacent cell, the channel width in the unit cell decreases (S in FIG. 13D).

Figure 14:
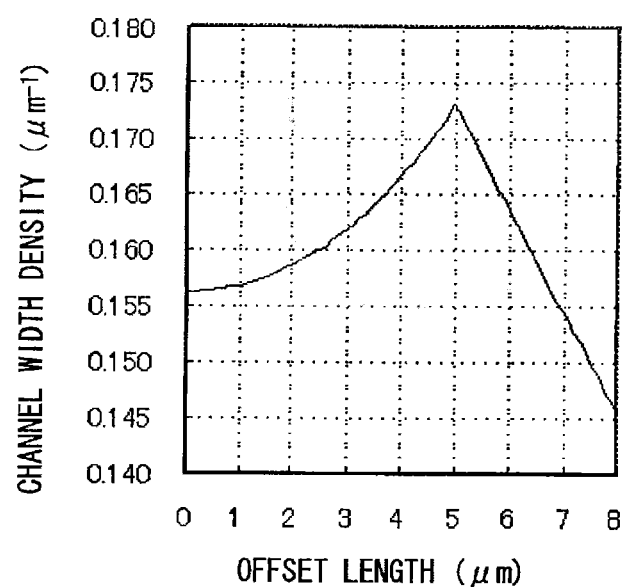
FIG. 14 is a diagram illustrating offset length dependence of channel width density.

FIG. 14 is a diagram illustrating the relationship between the offset amount and the channel width density. A horizontal axis is the offset length (μm) and a vertical axis is the channel width density ($\mu^{-1}$). The numerical values used for calculation are Lox=Loy, Px=16 μm, Py=16 μm, Lch=1 μm, and Lj=4 μm.

From FIG. 14, it will be appreciated that the channel width density becomes larger as the offset amount is increased, and the channel width density becomes maximum when the offset amount is Lox=Loy=Lch+Lj=5 μm. Moreover, as can be read from FIG. 14, it will be appreciated that, in a range of the offset length being approximately 0<Lox=Loy<3×Lch+Lj, the channel width density increases relative to Lox=Loy=0, that is, the grid arrangement.

Here, for simplicity, a case where Lox and Loy are identical is assumed and discussed, but even when Lox and Loy are different, the present invention can obtain the effect of the channel width density increase. That is, at least in the case as illustrated in FIG. 14, when both 0<Lox<3×Lchx+Ljx and 0<Loy<3×Lchy+Ljy are satisfied, the channel width density increases.

Moreover, the case where the channel length Lch and the JFET length Lj are uniform in the x-axis direction and the y-axis direction is assumed, but even when the channel length Lch and the JFET length Lj are different in the x-axis direction and the y-axis direction, the channel width density increases.

That is, at least in the case as illustrated in FIG. 14, when 0<Lox<3×Lchx+Ljx and 0<Loy<3×Lchy+Ljy are satisfied simultaneously, the effect of increase of the channel width density is obtained, and particularly when Lox=Lchx+Ljx and Loy=Lchy+Ljy, the channel width density becomes maximum.

In addition, in achieving the present arrangement, minimum processing dimensions and the like for forming the well region 30 and the source region 40 and the like may be the same as those of the grid arrangement. That is, by using the present arrangement, improvement in processing accuracy is not required, and improvement in the channel width density and improvement in reliability can be achieved simultaneously.

<Variation>

As description of the effectiveness of the present invention, the MOSFET has been taken as an example, but the present invention can be applied to an element that is a vertical semiconductor device having a channel that is formed in a direction parallel to a main surface. That is, the present invention is also effective in the IGBT.

The present invention is particularly effective in a semiconductor element using silicon carbide, as described above, but the present invention is also effective in other wide-bandgap semiconductor elements, and has a certain effect also in semiconductor elements using silicon.

Moreover, description has been provided using specific examples, such as a crystal structure, a plane direction of a main surface, an off-angle, and each implanting condition, but the scope of the present invention is not limited to these examples.

<Effect>

According to the embodiment of the present invention, the semiconductor device includes the first conductivity type (n-type) or second conductivity type (p-type) semiconductor substrate 10, the first conductivity type (n-type) drift layer 20 formed on the semiconductor substrate 10, the plurality of quadrangle-shaped second conductivity type (p-type) well regions 30 disposed periodically in a surface layer of the drift layer 20 with the length of the first side (side of the x-axis direction) in plan view being a (corresponding to Px−Ljx in FIG. 11) and the length of the second side (side of the y-axis direction) orthogonal thereto in plan view being b (corresponding to Py−Ljy in FIG. 11), the first conductivity type (n-type) source region 40 formed in the surface layer of each of the well regions 30, the gate electrode 60 formed over from each source region 40 to the drift layer 20 via the gate insulating film 50, and the channel region specified in the well region 30 opposite to each gate electrode 60.

The distance between each well region 30 in the x-axis direction is A (corresponding to Ljx in FIG. 11), the distance between each well region 30 in the y-axis direction is B (corresponding to Ljy in FIG. 11), among the well regions 30, the second well region (corresponding to the well region B in FIGS. 3, 5, and 7) adjacent to the first well region (corresponding to the well region A in FIGS. 3, 5, and 7) in the x-axis direction is disposed misaligned from the first well region in the y-axis direction by a width larger than zero and smaller than b+B, and among the well regions 30, the third well region (corresponding to the well region C in FIGS. 3, 5, and 7) adjacent to the first well region in the y-axis direction is disposed misaligned from the first well region in the x-axis direction by a width larger than zero and smaller than a+A.

This configuration allows improvement in reliability of the device while suppressing increase of the conduction loss and the switching loss.

That is, a smaller distance to farthest point Y relieves the electric field applied to the gate insulating film 50 at the time of reverse bias application and improves reliability.

Moreover, when the length Lox and the length Loy are in a predetermined range, a smaller area of the unit cell increases the channel width density and can reduce on-resistance.

Moreover, since a channel with an electric distance far from the source electrode does not exist, increase in the conduction loss and the switching loss can be suppressed.

In addition, according to the embodiment of the present invention, the semiconductor device includes the first conductivity type (n-type) or second conductivity type (p-type) semiconductor substrate 10, the first conductivity type (n-type) drift layer 20 formed on the main surface of the semiconductor substrate 10, the plurality of second conductivity type (p-type) well regions 30 formed periodically in the surface layer of the drift layer 20, the first conductivity type (n-type) source region 40 formed partially in the surface layer of each of the well regions 30, the gate electrode 60 formed over from each of the source region 40 to the drift layer 20 via the gate insulating film 50, the first conductivity type JFET region formed between each of the well regions 30, and the channel region specified in the well regions 30 opposite to each of the gate electrode 60.

When the x-axis and the y-axis which are orthogonal to each other on the main surface of the semiconductor substrate 10 are defined along the direction in which the channel region is specified, and when the two-dimensional shape on the main surface of the semiconductor substrate 10 is defined as the unit cell, the shape being a repeating unit of the well region 30, one unit cell (corresponding to the unit cell surrounding the well region A in FIGS. 3, 5, and 7) and another unit cell adjacent in the x-axis direction (corresponding to the unit cell surrounding the well region B in FIGS. 3, 5, and 7) are disposed misaligned by a length larger than zero in the y-axis direction and smaller than a length of the unit cell in the y-axis direction, and one unit cell and another unit cell adjacent in the y-axis direction (corresponding to the unit cell surrounding the well region C in FIGS. 3, 5, and 7) are disposed misaligned by a length larger than zero in the x-axis direction and smaller than a length of the unit cell in the x-axis direction.

Here, the length of the unit cell is, for example, a length of a region surrounded by the central line R of FIG. 3 in the x-axis direction or the y-axis direction, and when it is taken into consideration that the central line R is a line that separates the JFET length in the center, it will be appreciated that the length of the unit cell is eventually the length corresponding to the cell pitch Px or the cell pitch Py of FIG. 11.

This configuration allows improvement in reliability of the device while suppressing increase of the conduction loss and the switching loss.

In addition, according to the embodiment of the present invention, in the semiconductor device, the well regions 30 which are adjacent to the common well region 30 from each of the y-axis direction and the x-axis direction are arranged partially overlapping each other in plan view, so that the area of the unit cell can be made smaller.

In addition, according to the embodiment of the present invention, the semiconductor device further includes the first conductivity type (n-type) source region 40 formed in the surface layer of each of well regions 30, and the source regions 40 which are adjacent to the common well region 30 from each of the y-axis direction and the x-axis direction are arranged partially overlapping each other in plan view, so that the area of the unit cell can be made smaller.

In addition, according to the embodiment of the present invention, in the semiconductor device, when a misalignment length in the x-axis direction of the well region 30 adjacent in the y-axis direction is Lox, a misalignment length in the y-axis direction of the well region 30 adjacent in the x-axis direction is Lox, a distance between the well regions 30 in the x-axis direction is Ljx and a distance between the well regions 30 in the y-axis direction is Ljy, a channel length in the x-axis direction formed between the surface layer of each of the well regions 30 and the source region 40 is Lchx, and a channel length in the y-axis direction formed between the surface layer of each of the well regions 30 and the source region 40 is Lchy, then the area of the unit cell can be made smaller and the channel width density can be increased by 0<Lox<Lchx+Ljx and 0<Loy<Lchy+Ljy.

In addition, according to the embodiment of the present invention, in the semiconductor device, the area of the unit cell can be effectively made smaller and the channel width density can be increased by Lox=Lchx+Ljx and Loy=Lchy+Ljy.

The embodiment of the present invention describes the properties and materials of each component, the conditions for carrying out the present invention, and the like, but these are illustrative and not limited to those described.

Furthermore, in the present invention, variations or omissions of any component in the present embodiment are possible within the scope of the invention.

While the present invention has been described in detail, the foregoing description is in all aspects illustrative, and the present invention is not limited thereto. It is understood that countless variations that are not exemplified can be considered without departing from the scope of the present invention.

REFERENCE SIGNS LIST 10 semiconductor substrate, 20 drift layer, 30 well region, 35 well contact region, 40 source region, 50 gate insulating film, 60 gate electrode, 70 source electrode, 80 drain electrode, 90 Interlayer insulating film.

The invention claimed is:

1. A semiconductor device comprising:
a first conductivity type or second conductivity type semiconductor substrate;
a first conductivity type drift layer formed on said semiconductor substrate;
a plurality of quadrangle-shaped second conductivity type well regions disposed periodically in a surface layer of said drift layer with a length of a first side in plan view being a and a length of a second side orthogonal thereto in plan view being b;
a first conductivity type source region formed in a surface layer of each of said well regions;
a gate electrode formed over from each of said source region to said drift layer via a gate insulating film; and
a channel region specified in said well regions opposite to each of said gate electrode, wherein
when a direction of said first side is an x-axis direction and a direction of said second side is a y-axis direction, and
when a distance between each of said well regions in said x-axis direction is A and a distance between each of said well regions in said y-axis direction is B,
a second well region adjacent to a first well region in the x-axis direction, among said well regions, is disposed misaligned from said first well region in the y-axis direction by a width larger than zero and smaller than b+B, and
a third well region adjacent to the first well region in the y-axis direction, among said well regions, is disposed misaligned from said first well region in the x-axis direction by a width larger than zero and smaller than a+A.

2. The semiconductor device according to claim 1, wherein each of said well regions is arranged spaced from each other in plan view.

3. The semiconductor device according to claim 1, wherein,
when a misalignment length in said x-axis direction of said well regions adjacent in said y-axis direction is Lox,
a misalignment length in said y-axis direction of said well regions adjacent in said x-axis direction is Loy,
a distance between said well regions in said x-axis direction is Ljx and a distance between said well regions in said y-axis direction is Ljy, and
a channel length in said x-axis direction formed between the surface layer of each of said well regions and said source region is Lchx, and a channel length in said y-axis direction formed between the surface layer of each of said well regions and said source region is Lchy, 0<Lox<Lchx+Ljx and 0<Loy<Lchy+Ljy.

4. The semiconductor device according to claim 1, wherein a device structure is one of a MOSFET and an IGBT.

5. The semiconductor device according to claim 1, wherein said semiconductor substrate and said drift layer include a wide-bandgap semiconductor.

6. The semiconductor device according to claim 1, wherein said semiconductor substrate and said drift layer include silicon carbide.

7. The semiconductor device according to claim 1, wherein said well regions adjacent to a common well region from each of said y-axis direction and said x-axis direction are arranged partially overlapping each other in plan view.

8. The semiconductor device according to claim 7, wherein said source region is arranged partially overlapping each other in plan view.

9. The semiconductor device according to claim 7, wherein said source region is not partially overlapping each other in plan view.

\* \* \* \* \*